US007860466B2

(12) United States Patent
Woo et al.

(10) Patent No.: US 7,860,466 B2
(45) Date of Patent: *Dec. 28, 2010

(54) SYSTEMS, METHODS, AND APPARATUSES FOR LINEAR POLAR TRANSMITTERS

(75) Inventors: Wangmyong Woo, Cumming, GA (US); Chang-Ho Lee, Marietta, GA (US); Jaejoon Chang, Duluth, GA (US); Haksun Kim, Daejeon (KR)

(73) Assignee: Samsung Electro-Mechanics Company, Ltd. (KR)

( * ) Notice: Subject to any disclaimer, the term of this patent is extended or adjusted under 35 U.S.C. 154(b) by 537 days.

This patent is subject to a terminal disclaimer.

(21) Appl. No.: 11/754,112

(22) Filed: May 25, 2007

(65) Prior Publication Data

US 2007/0298734 A1 Dec. 27, 2007

Related U.S. Application Data

(60) Provisional application No. 60/803,871, filed on Jun. 4, 2006.

(51) Int. Cl.
*H04B 1/04* (2006.01)
(52) U.S. Cl. .................. 455/114.3; 455/126; 455/114.2
(58) Field of Classification Search ............... 455/114.3
See application file for complete search history.

(56) References Cited

U.S. PATENT DOCUMENTS 5,420,536 A    5/1995    Faulkner et al.

(Continued)

FOREIGN PATENT DOCUMENTS

DE    10257436 A1    9/2003

(Continued)

OTHER PUBLICATIONS

Office Action dated Apr. 1, 2008 for Korean Application No. 10-2007-005710.

(Continued)

*Primary Examiner*—Yuwen Pan
*Assistant Examiner*—Ajibola Akinyemi
(74) *Attorney, Agent, or Firm*—Sutherland Asbill & Brennan LLP (57) ABSTRACT

Systems and methods are disclosed for providing a linear polar transmitter. The systems and methods may include generating an input amplitude signal and an input phase signal, where the input amplitude signal and the input phase signal are orthogonal components of an input signal, and where the input amplitude signal and the input phase signal are generated on respective first and second signal paths. The systems and methods may also include processing the input amplitude signal along the first signal path using an amplitude error signal to generate a predistorted amplitude signal, and processing the input phase signal along the second signal path using an phase error signal to generate a predistorted phase signal. The systems and methods may also include providing the predistorted amplitude signal along the first signal path and the predistorted phase signal along the second signal path to a power amplifier to generate an output signal, where the amplitude error signal is generated from a comparison of at least an amplitude portion of the output signal with the predistorted amplitude signal and where the phase error signal is generated from a comparison of at least a phase portion of the output signal with the predistorted phase signal.

20 Claims, 12 Drawing Sheets

U.S. PATENT DOCUMENTS

| | | | |
|---|---|---|---|
| 5,742,201 | A | 4/1998 | Eisenberg et al. |
| 6,141,390 | A * | 10/2000 | Cova ........................... 375/297 |
| 6,236,267 | B1 | 5/2001 | Anzil |
| 6,295,442 | B1 | 9/2001 | Camp, Jr. et al. |
| 6,396,345 | B2 | 5/2002 | Dolman |
| 6,449,465 | B1 * | 9/2002 | Gailus et al. ................. 455/126 |
| 6,642,786 | B1 * | 11/2003 | Jin et al. ..................... 330/149 |
| 6,794,938 | B2 * | 9/2004 | Weldon ....................... 330/149 |
| 6,831,905 | B1 | 12/2004 | Lomp et al. |
| 6,914,483 | B2 | 7/2005 | Shigaki |
| 6,985,467 | B2 | 1/2006 | Lomp et al. |
| 7,024,620 | B2 | 4/2006 | Ponce et al. |
| 7,042,286 | B2 * | 5/2006 | Meade et al. ................ 330/149 |
| 7,379,715 | B2 * | 5/2008 | Udagawa et al. ............. 455/126 |
| 7,460,613 | B2 * | 12/2008 | Sahlman ..................... 375/296 |
| 7,532,676 | B2 | 5/2009 | Fonseka et al. |
| 2002/0196864 | A1 | 12/2002 | Booth et al. |
| 2005/0239422 | A1 | 10/2005 | Jafari et al. |
| 2006/0071711 | A1 * | 4/2006 | Persson et al. .............. 330/149 |
| 2006/0178120 | A1 | 8/2006 | Puma |

FOREIGN PATENT DOCUMENTS

| | | |
|---|---|---|
| DE | 10257435 B3 | 9/2004 |
| EP | 1017162 A2 | 7/2000 |
| EP | 1691518 A2 | 8/2006 |
| GB | 2380880 A | 4/2003 |
| KR | 1020040016366 A | 2/2004 |
| WO | 0233844 A | 4/2002 |
| WO | 0247249 A | 6/2002 |

OTHER PUBLICATIONS

Woo, W., A Predistortion Linearization System for High Power Amplifiers with Low Frequency Envelop Memory Effects, Microwave Symposium Digest, 2005, IEEE MTT-S International, Jun. 12-17, 2005, 4 pages.

Geman Office Action issued on Aug. 23, 2008 for German Patent Application No. 102007026022.

United Kingdom Search Report for GB0710605.7, dated Sep. 27, 2007.

United Kingdom Search Report for GB0710609.9, dated Sep. 27, 2007.

United Kingdom Search Report for GB0710602.4 dated Sep. 27, 2007.

Notice of Allowance for U.S. Appl. No. 11/754,119 mailed Sep. 16, 2008.

Notice of Allowance for U.S. Appl. No. 11/754,119 mailed Jan. 9, 2009.

Notice of Allowance for U.S. Appl. No. 11/754,122 mailed Nov. 13, 2009.

Office Action for Chinese Application No. 200710110606 dated Jun. 5, 2010.

* cited by examiner

SYSTEMS, METHODS, AND APPARATUSES FOR LINEAR POLAR TRANSMITTERS

RELATED APPLICATION

This application claims priority to U.S. Provisional Ser. No. 60/803,871, entitled "Systems, Methods, and Apparatuses for Linear Polar Transmitters," filed on Jun. 4, 2006, which is incorporated by reference as if fully set forth herein.

FIELD OF THE INVENTION

The invention relates generally to linear polar transmitters, and more particularly to systems, methods, and apparatuses for the performance enhancement of radio frequency (RF) power amplifiers.

BACKGROUND OF THE INVENTION

In cost-sensitive mobile transmitters, performance trade-offs must be carefully managed to achieve high efficiency and high output power at the required gain and linearity. With an intrinsically nonlinear power amplifier (PA) itself, the only way to achieve a better linear operation is to restrict the dynamic range of signals to a small fraction of the PA's overall capability. Unfortunately, such a restriction in the dynamic range to achieve a more linear operation is quite inefficient since it requires the construction of an amplifier that is much larger in size and consumes more power.

With the demand to increase data transmission rates and communication capacity, Enhanced Data rate for GSM Evolution (EDGE) has been introduced within the existing GSM (Global System for Mobile communications) specifications and infrastructure. GSM is based on a constant envelope modulation scheme of Gaussian Minimum Shift Keying (GMSK), while EDGE is based on an envelope-varying modulation scheme of 3π/8-shifted 8-phase shift keying (8-PSK) principally to improve spectral efficiency. Because of this envelope-varying modulation scheme, EDGE transmitters are more sensitive to PA nonlinearities, which can significantly and negatively affect the performance of an EDGE handset. As a result, EGDE transmitters require accurate amplitude and phase control with additional blocks to compensate for distortion caused by the PA nonlinear characteristics and non-constant envelope variation.

To provide for efficiently amplified signal transmissions, many polar transmitter architectures have been proposed in the form of either an open-loop with digital predistortion scheme or a closed-loop with analog feedback scheme. First, in the conventional open-loop with digital predistortion scheme, the PA is characterized by calibration data including power, temperature, and frequency. The calibration data is then stored in look-up tables. The correct coefficients for the operating conditions from the look-up table are selected by digital logic and applied for predistortion. The DSP-based linearization can provide an accurate, stable operation as well as easy modification by the power of software programming. However, this technique requires time-consuming calibration on the production line to compensate for part-to-part variations and cannot easily correct any aging effect in the system. When employing a path for reflecting changes at the PA output to linearization, the circuitry becomes large and costly and consumes a considerable amount of DC power.

Second, a polar loop envelope feedback control is generally used for analog linearization. In such a feedback control structure, a precise receiver has to be included within the transmitter and the control loop bandwidth should greatly exceed the signal bandwidth. In addition, the intrinsic gain reduction characteristic in the negative feedback may cause a severe restriction to amplifiers that do not have enough transmission gain. Additionally, conventional polar loop systems feed back both distortion and signal power, thereby reducing the stability of the polar loop systems. Likewise, power amplifiers used in these conventional polar modulation systems are operated at highly nonlinear switching modes for efficiency so the cancellation of high-order distortion components becomes more important.

BRIEF SUMMARY OF THE INVENTION

Embodiments of the invention may provide for an analog linear polar transmitter using multi-path orthogonal recursive predistortion. This transmitter may operate in a low power mode and achieve greater bandwidth by feeding the low-frequency even-order distortion components (i.e., the deviation from linear gain) back. Moreover, the distortion components may not be added to the input signal as feedback, but rather may be used to predistort the input signal in a multiplicative manner. In particular, the low-frequency even-order distortion components may generate odd-order in-band distortion terms when they are multiplied by the fundamental signal. Thus, such architecture may be inherently more stable than conventional additive polar loop systems.

According to an embodiment of the invention, there is a method for providing a linear polar transmitter. The method may include generating an input amplitude signal and an input phase signal, where the input amplitude signal and the input phase signal are orthogonal components of an input signal, and where the input amplitude signal and the input phase signal are generated on respective first and second signal paths, processing the input amplitude signal along the first signal path using an amplitude error signal to generate a predistorted amplitude signal, and processing the input phase signal along the second signal path using an phase error signal to generate a predistorted phase signal. The method may further include providing the predistorted amplitude signal along the first signal path and the predistorted phase signal along the second signal path to a power amplifier to generate an output signal, where the amplitude error signal is generated from a comparison of at least an amplitude portion of the output signal with the predistorted amplitude signal and where the phase error signal is generated from a comparison of at least a phase portion of the output signal with the predistorted phase signal.

According to another embodiment of the invention, there is a system for a linear polar transmitter. The system may include an input amplitude signal and an input phase signal, where the input amplitude signal and the input phase signal are orthogonal components of an input signal, and where the input amplitude signal and the input phase signal are provided on respective first and second signal paths. The system may also include a first predistortion module that processes the input amplitude signal along the first signal path using an inverse amplitude error signal to generate a predistorted amplitude signal, and a second predistortion module that processes the input phase signal along the second signal path using an inverse phase error signal to generate a predistorted phase signal. The system may further include a power amplifier that receives the predistorted amplitude signal along the first signal path and the predistorted phase signal along the second signal path and generates an output signal based upon the predistorted amplitude signal and the predistorted phase signal, where the amplitude error signal is generated from a comparison of at least an amplitude portion of the output signal with the predistorted amplitude signal and where the phase error signal is generated from a comparison of at least a phase portion of the output signal with the predistorted phase signal.

According to yet another embodiment of the invention, there is a system for a linear polar transmitter. The system may include an input amplitude signal and an input phase signal, where the input amplitude signal and the input phase signal are orthogonal components of an input signal, and where the input amplitude signal and the input phase signal are provided on respective first and second signal paths. The system may also include first means for processing the input amplitude signal along the first signal path using an inverse amplitude error signal to generate a predistorted amplitude signal, and second means for processes the input phase signal along the second signal path using an inverse phase error signal to generate a predistorted phase signal. The system may further include a power amplifier that receives the predistorted amplitude signal along the first signal path and the predistorted phase signal along the second signal path and generates an output signal based upon the predistorted amplitude signal and the predistorted phase signal, where the amplitude error signal is generated from a comparison of at least an amplitude portion of the output signal with the predistorted amplitude signal and where the phase error signal is generated from a comparison of at least a phase portion of the output signal with the predistorted phase signal.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein;

DETAILED DESCRIPTION OF THE INVENTION

The invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may provide linear polar transmitters that are based upon a polar modulation technique using two respective paths for amplitude and phase, and an analog orthogonal recursive predistortion linearization technique. The polar modulation technique may enhance the battery life by dynamically adjusting the bias level of a power amplifier. Additionally, the analog orthogonal recursive predistortion may provide for a substantially instantaneous correction of amplitude and phase errors in a radio frequency (RF) power amplifier (PA), thereby enhancing the linear output power capability and efficiency of the PA. Additionally, embodiments of the invention may utilize even-order distortion components to predistort the input signal in a multiplicative manner, which allows for correction of any distortion that may occur within the correction loop bandwidth, including envelope memory effects.

Figure 1A:
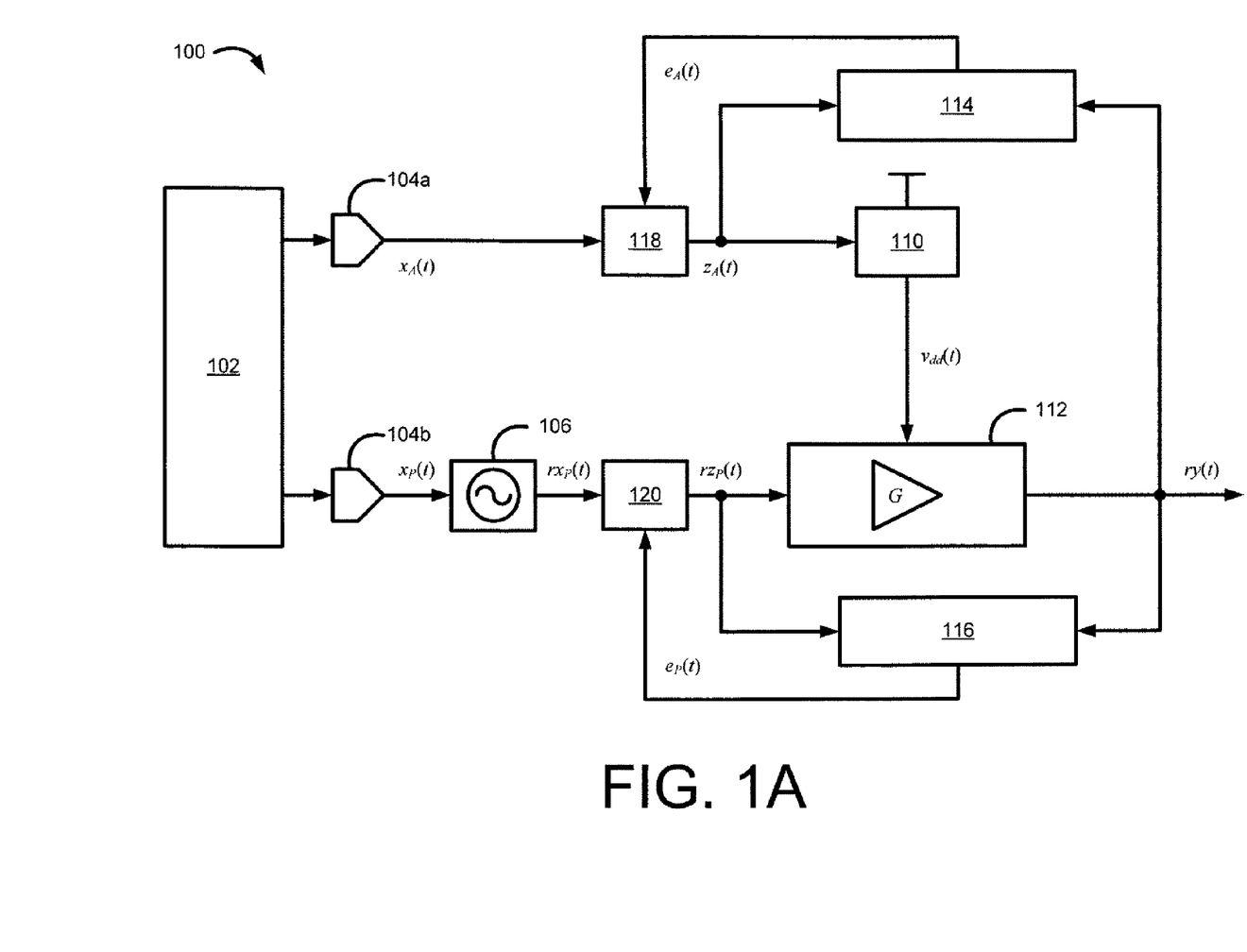
FIGS. 1A and 1B illustrate functional block diagrams of an polar transmitter system in accordance with an embodiment of the invention.

FIG. 1A illustrates a simplified functional block diagram of an illustrative polar transmitter system 100 in accordance with an embodiment of the invention. As shown in FIG. 1A, the polar transmitter system 100 may include a baseband modulation & control module 102, digital-to-analog converters (DACs) 104a and 104b, a phase modulator module 106, an amplitude predistortion module 108, an amplifier power control (APC) module 110, a power amplifier module 112, an amplitude modulation error detection module 114, and a phase modulation error detection module 116. During operation of the polar transmitter system 100, the baseband modulation & control module 102 may generate two orthogonal input signals—one representing the amplitude and one representing the phase of the input signal, which are respectively provided to the digital-to-analog converters (DACs) 104a and 104b, respectively. The two baseband digital input signals may be synchronized according to an embodiment of the invention. It will be appreciated that while the two orthogonal input signals are associated with amplitude and phase, respectively, other embodiments of the invention may utilize I- and Q-components for a Cartesian system. Furthermore, other orthogonal input signals may be utilized as well without departing from embodiments of the invention.

The analog amplitude signal $x_A(t)$ at the output of DAC 104a may be provided to the amplitude predistortion module 118 as the input amplitude signal. Likewise, the analog phase signal $x_P(t)$ at the output of DAC 104b is provided to the phase modulation module 106 in order to upconvert the analog phase modulation signal $x_P(t)$ from a baseband signal to a RF signal $rx_P(t)$. The resulting input amplitude signal $rx_P(t)$ may then be provided to the phase predistortion module 120.

The amplitude predistortion module 118 and the phase predistortion module 120 will now be discussed with respect to FIG. 1B, which provides a more detailed functional block diagram of the polar transmitter system 100 of FIG. 1A. As illustrated, the amplitude predistortion module 118 may be a multiplier and the predistortion module 118 may be a phase adder. According to an embodiment of the invention, the amplitude multiplier for amplitude predistortion may be a Gilbert cell voltage multiplier, while the phase adder for phase predistortion may be a voltage-controlled variable phase (VVP) shifter.

Figure 1B:
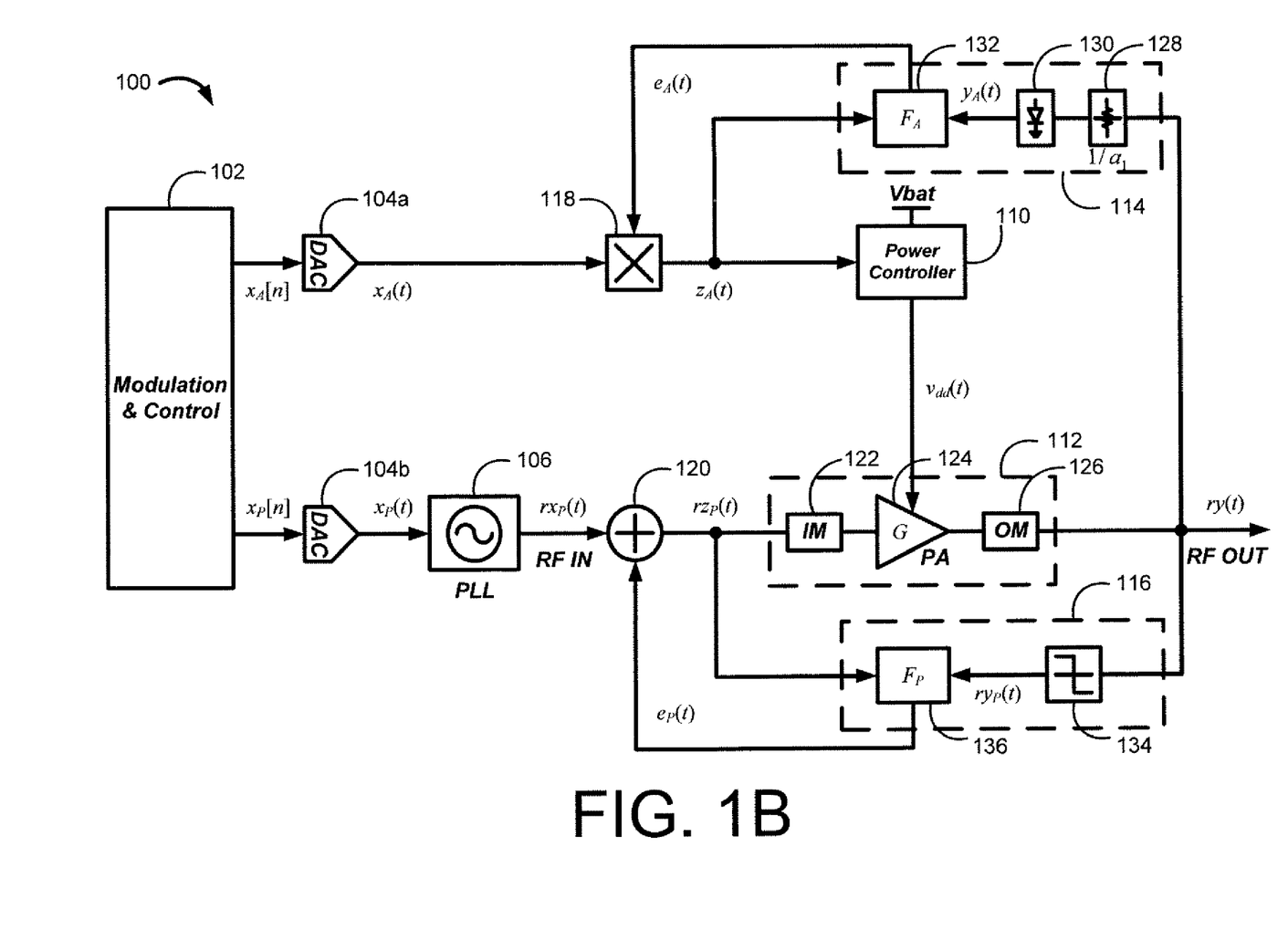

Still referring to FIG. 1B, the amplitude modulation error detection module 114 may include an attenuator 128 with the attenuation of $1/a_1$, an envelope detector (EDET) 130, and an amplitude predistortion function 132. The phase modulation error detection module 116 may include a limiter 134 and a phase predistortion function 136. The power amplifier module 112 includes a power amplifier 124 having transfer function G{·}. In addition, the power amplifier module 112 may additionally include one or more input matching (IM) circuits 122 and output matching (OM) circuits 126. The IM circuit 122 may provide for impedance matching at the input of the power amplifier 124 while the OM circuit 126 may provide for impedance matching at the output of the power amplifier 124.

As will be also described in further detail below, the amplitude predistortion module 118 and the phase predistortion module 120 may be operative to predistort the baseband amplitude signal $x_A(t)$ and the phase-modulated RF signal $rx_P(t)$, respectively. In particular, the amplitude signal input $x_A(t)$ may be predistorted by an inverse amplitude error signal $e_A(t)$ from the amplitude modulation error detection module 114, producing an amplitude-predistorted signal $z_A(t)$. As a result, the output $z_A(t)$ may contain the fundamental term of the input $x_A(t)$ as well as the inverse odd-order intermodulation distortion (IMD) terms of the output $y_A(t)$, such as third-order IMD, fifth-order IMD, and the like. The inverse amplitude distortion terms may be used in the power amplifier module 112 to compensate for the amplitude distortions of the PA output $ry(t)$.

To produce the inverse amplitude error signal $e_A(t)$, the amplitude modulation error detection module 114, and in particular the amplitude predistortion function 132, generally performs a comparison of the output $z_A(t)$ of the predistortion module 118 with the diode-detected output $y_A(t)$ of the power amplifier module 112. For example, the comparison of the output $z_A(t)$ of the amplitude predistortion module 118 with the envelope-detected output $y_A(t)$ of the PA output $ry(t)$ through a diode envelope detector 130 may be performed by a voltage divider. By dividing the signal $z_A(t)$ by the signal $y_A(t)$, the odd-order distortion terms, which are located near to the fundamental term, are order-down converted to the lower odd-order distortion terms. The inverse amplitude error signal $e_A(t)$ may include the inverse amplitude gain of the power amplifier module 112. The inverse amplitude error signal $e_A(t)$ may also include low-frequency, even-order intermodulation distortion terms, alleviating the required bandwidth of components operating in the amplitude error correction loop.

Likewise, the phase-modulated RF signal input $rx_P(t)$ may be predistorted by an inverse phase error signal $e_P(t)$ from the phase modulation error detection module 116, producing a phase-predistorted RF signal $rz_P(t)$. As a result, the output $rz_P(t)$ may contain the fundamental term of the input $rx_P(t)$ as well as the inverse odd-order intermodulation distortion (IMD) terms of the output $ry_P(t)$, such as third-order IMD, fifth-order IMD, and the like. The inverse phase distortion terms may be used in the power amplifier module 112 to compensate for the phase distortions of the PA output $ry(t)$.

To produce the inverse phase error signal $e_P(t)$, the phase modulation error detection module 116, and in particular, the phase predistortion function 436, generally performs a comparison of the output $rz_P(t)$ of the predistortion module 120 with the amplitude-limited output $ry_P(t)$ of the power amplifier module 112. For example, the comparison of the output $rz_P(t)$ of the phase predistortion module 120 with the amplitude-limited output $ry_P(t)$ of the PA output $ry(t)$ through a limiter 134 may be performed by a Gilbert-cell voltage multiplier. When relatively small amplitude signals are applied to the input ports of the Gilbert-cell voltage multiple, it may behave as an analog multiplier. If the phase error of the inputs is in the vicinity of 90°, the average value of the output may be linearly proportional to the phase error. The inverse amplitude error signal $e_P(t)$ may include the inverse phase deviation of the power amplifier module 112. The inverse phase error signal $e_A(t)$ may also include low-frequency, even-order intermodulation distortion terms, thereby alleviating the required bandwidth of components operating in the phase error correction loop.

In FIG. 1B, the polar transmitter system 100 provides a linearization scheme to look at any changes of the PA output $ry(t)$ and almost instantaneously predistort the input signal $x_A(t)$ and $rx(t)$. More specifically, the predistortion mechanism in accordance with an embodiment of the invention may utilize the predistorted signal toward the PA 124 as the reference for recursive predistortion so that the outputs $e_A(t)$ and $e_P(t)$ of modulation error detection modules 114, 116 may be simply the reciprocal of the PA 124 transfer function G{·}. Accordingly, the calculation of the predistortion function (e.g., $F_A$ 132, $F_P$ 136) may be performed by analog components.

If the amplitude modulation (AM) and phase modulation (PM) paths are fully synchronized, then the PA 124 input signal $rz(t)$, which comes from the multiplication of the transmitter input signal $rx(t)$ with the inverse PA distortion signal $e(t)$, may be defined as follows:

$$rz(t) = z_A(t) \angle rz_P(t) \quad (1)$$
$$= \{x_A(t) \cdot e_A(t)\} \angle \{rx_P(t) + e_P(t)\}$$
$$= rx(t) \cdot e(t),$$

where $x_A(t)$ and $rx_P(t)$ are the baseband amplitude input and the phase-modulated RF input, respectively. Likewise, $e_A(t)$ and $e_P(t)$ are the outputs of the predistortion function $F_A\{\cdot\}$ 132 for amplitude and $F_P\{\cdot\}$ 136 for phase, respectively.

As the system 100 of FIG. 1B may be based on polar modulation, the amplitude signal $e_A(t)$ and phase signal $e_P(t)$ of the inverse PA distortion signal $e(t)$ may be calculated separately via the amplitude function $F_A\{\cdot\}$ 132 and phase error predistortion function $F_P\{\cdot\}$ 136, respectively. When up to third-order terms (K=2) in PA nonlinear components and a complex-form analysis are considered for simplicity, the output $y(t)$ of the PA 124 may be described as follows:

$$y(t) = rz(t) \cdot G\{z_A(t)\} \quad (2)$$
$$= [rx(t) \cdot e(t)] \cdot G\{z_A(t)\},$$

$$G\{z_A(t)\} = \sum_{k=1}^{K} a_{2k-1} \cdot z_A^{2(k-1)}(t), \quad (3)$$

$$e(t) = F\{z_A(t)\} = a_1 \cdot G^{-1}\{z_A(t)\}, \quad (4)$$

where G{·} is the PA 124 odd-order transfer function, F{·} is the predistortion function comprised of $F_A$ 132 and $F_P$ 136, and $a_k$ is the k-th complex coefficient of the PA 124 transfer function. As a result obtained from equations (1) to (4) above, a linearly amplified RE signal $a_1 \cdot rx(t)$ can simply be produced with this architecture, according to an embodiment of the invention.

Figure 2:
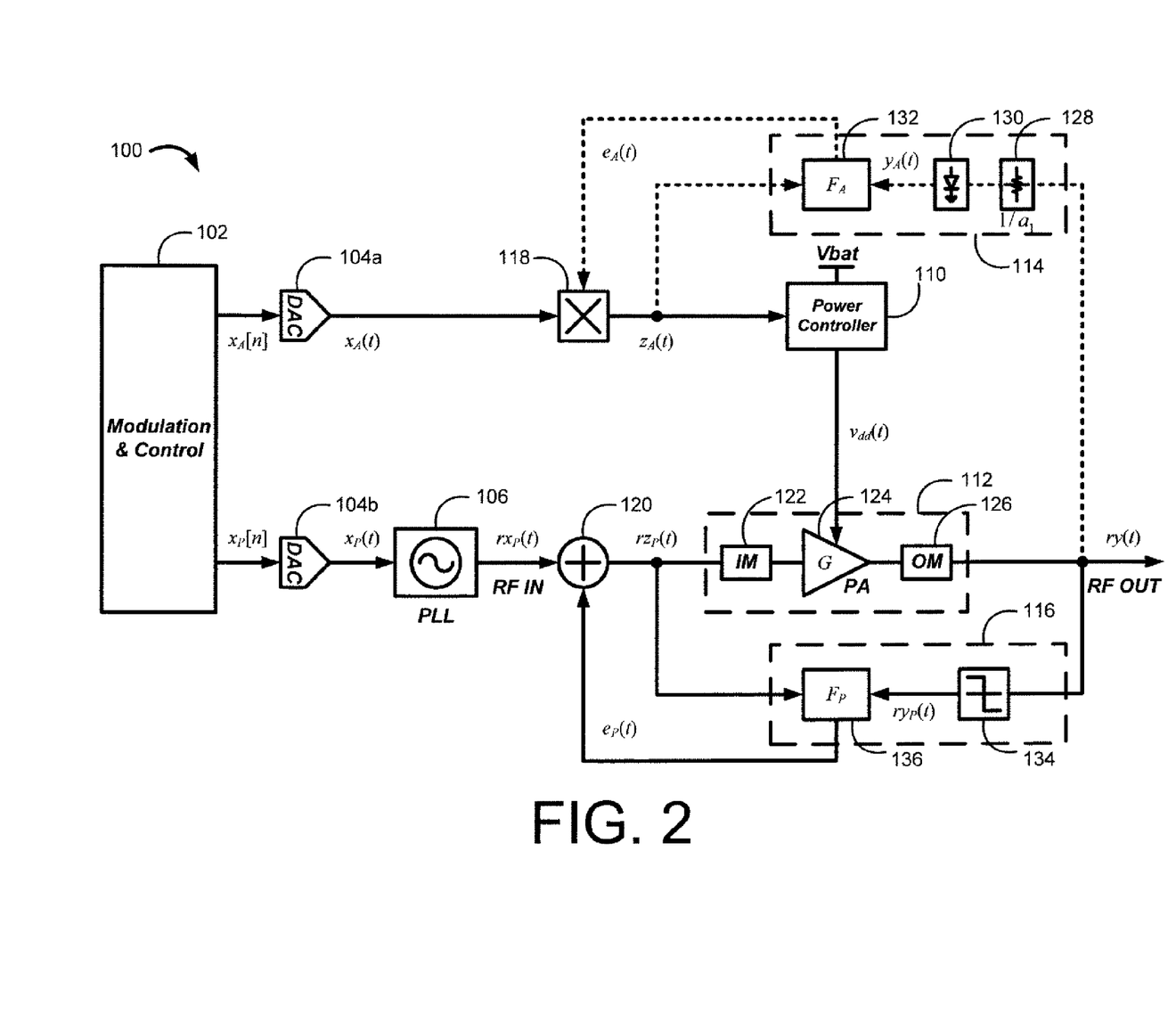
FIG. 2 illustrates an amplitude error correction loop in accordance with an embodiment of the invention.

Amplitude Error Correction. The amplitude error correction loop, which includes the amplitude modulation error detection module 114, will be described with reference to FIG. 2. The inverse amplitude error signal $e_A(t)$ may be obtained by the comparison of the output $z_A(t)$ of an amplitude predistortion module 118 (e.g., multiplier) and the output $y_A(t)$ of a diode-based envelope detector (EDET) 130. Once the amplitude error signal $e_A(t)$ is obtained, it may be multiplied with the input amplitude signal $x_A(t)$ to produce the amplitude-predistorted signal $z_A(t)$. This process may be performed recursively.

Figure 3:
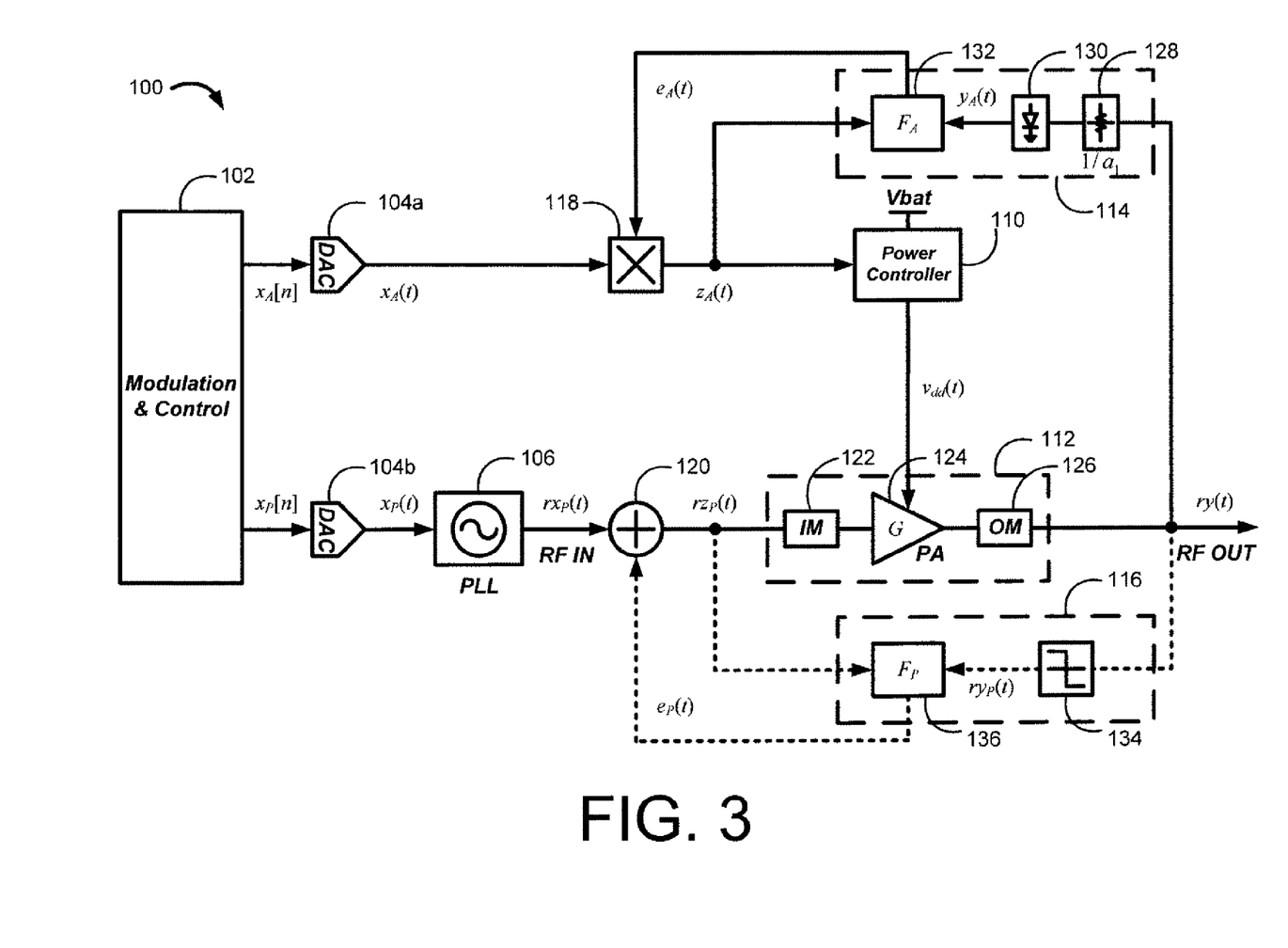
FIG. 3 illustrates the phase error correction loop in accordance with an embodiment of the invention.

Phase Error Correction. FIG. 3 illustrates the phase error correction loop, which includes the phase modulation error detection module 116. As in the amplitude correction loop, the inverse phase error signal $e_P(t)$ is obtained from the comparison of the output $rz_P(t)$ of a phase predistortion module 120 (e.g., phase adder) and the amplitude-limited output $y_P(t)$ of an amplitude limiter 134. Once the phase error signal $e_P(t)$ is obtained, it is added to the phase-modulated RF input signal $rx_P(t)$ to produce the phase-predistorted signal $rz_P(t)$. Since the output $rx_P(t)$ of a phase-locked loop (PLL), which is used as the phase modulation module 106, is at radio frequency, the phase predistortion module 120 may be implemented by a reflection-type voltage-controlled variable phase shifter (VVP), according to an embodiment of the invention.

Figure 4:
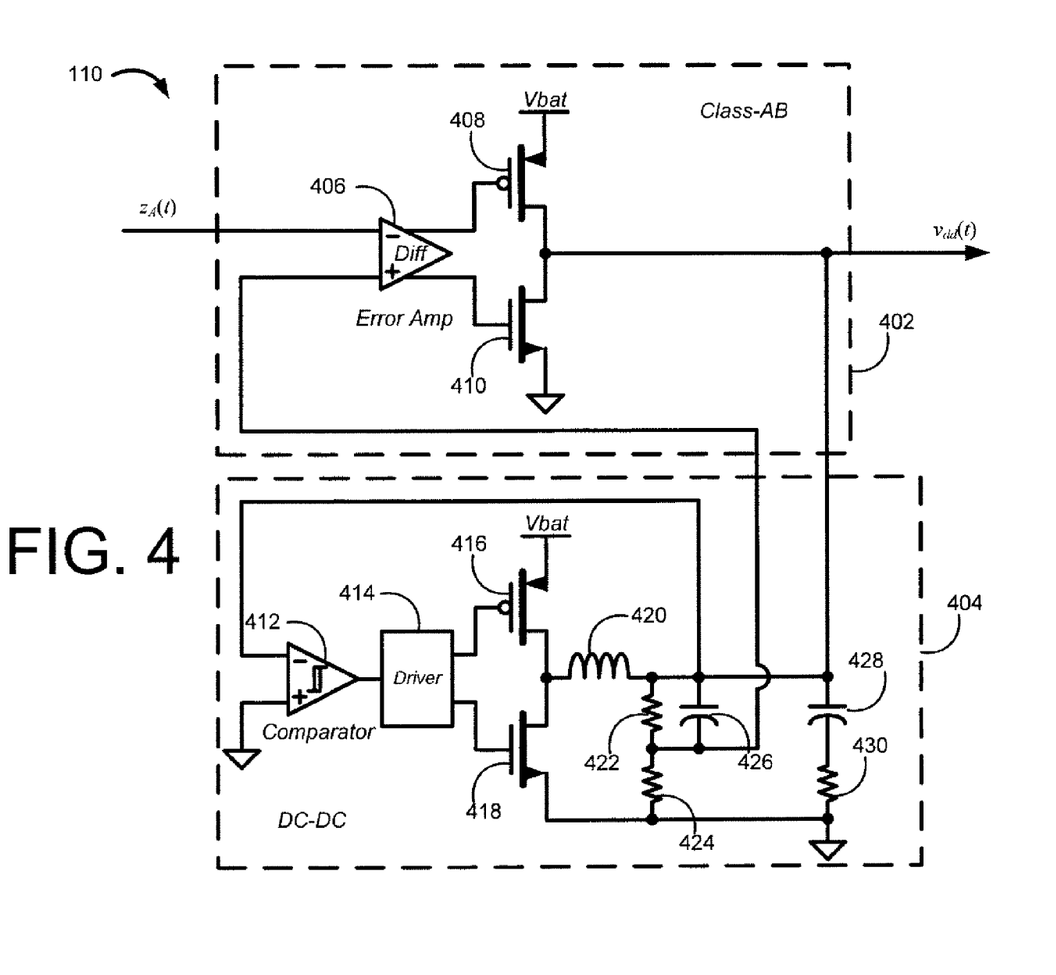
FIG. 4 illustrates the amplitude modulation scheme in accordance with an embodiment of the invention.

Amplitude Modulation. In time-division multiple access (TDMA) communication systems such as GSM/EDGE, the power control of a PA output has to meet the time mask specification, while preserving the efficiency of the power supply. This power control may be performed by using a linear regulator, switching regulator, or combined structure. Unlike the GSM system, a polar EDGE system in accordance with an embodiment of the invention may require the tracking of RF envelope signals. Tracking the envelope signal may require a much wider operation bandwidth. FIG. 4 shows an illustrative example of a combined PA controller 110 scheme that may be employed for power efficiency and wideband operation. As shown in FIG. 4, the DC-DC converter 404 may provide the DC and low frequency load current, while the Class-AB linear amplifier 402 may provide the high frequency load current, maintaining the tracking loop closed. The DC-DC converter 404 may be controlled by the output current of the Class-AB amplifier 402. The hysteric current controller of the DC-DC converter 404 may attempt to minimize the output current of the Class-AB amplifier 402, to maximize the overall efficiency. The output capacitance 428 of the architecture may be low to maintain the high bandwidth of the Class-AB amplifier 402 loop. Moreover, the ripple current of the DC-DC converter 404 may be principally absorbed by the Class-AD linear amplifier 402 operating in conjunction with a feedback loop. Thus, this linear-assisted architecture may be expected to have a high envelope tracking bandwidth, preserving a good linearity and efficiency.

Figure 5:
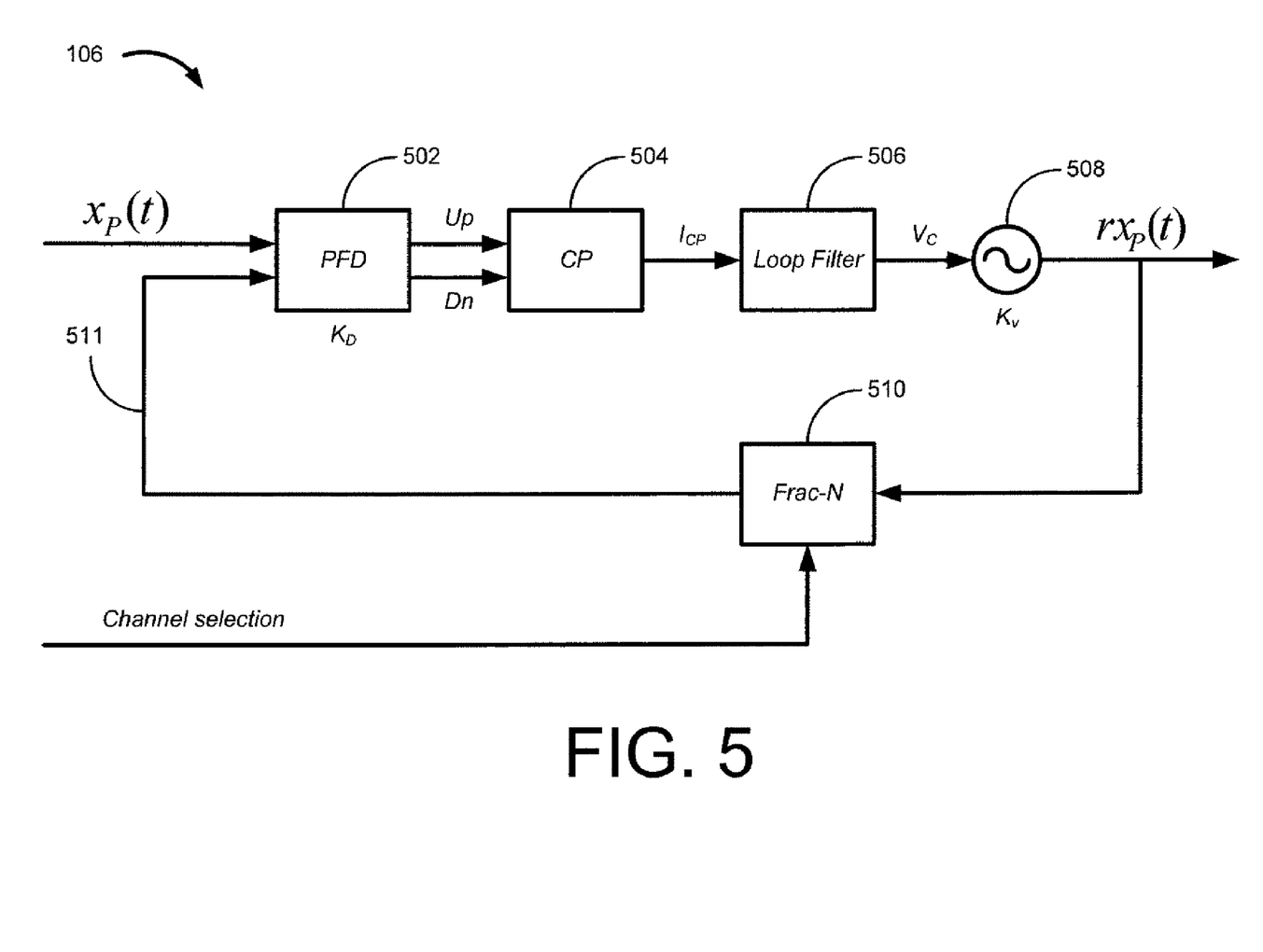
FIG. 5 illustrates the phase modulation scheme in accordance with an embodiment of the invention.

Phase Modulation. FIG. 5 illustrates a phase modulator module 106 that may be utilized in accordance with an embodiment of the invention. Referring to FIG. 5, a phase-modulated intermediate frequency (IF) signal $x_P(t)$ 501 is applied to the phase-frequency detector (PFD) 502 for both phase-locking reference and phase modulation. The PFD 502 compares the IF signal 501 to the feedback signal 511 to generate current pulses. In particular, the voltage pulse (e.g., UP/DOWN) directs the charge pump (CP) 504 to supply charge amounts in proportion to the phase error detected. Generally, these pulses are small and substantially the same duration such that the CP 504 produces equal-charge positive and negative pulses when the phase is perfectly matched. The output $I_{CP}$ of the CP 504 is provided to a filter 506 (e.g., a loop filter), and the resultant signal Vc is provided to an oscillator 508 to generate a phase-corrected signal $rx_P(t)$.

In FIG. 5, with an IF reference signal 501 carrying the phase information, a large portion of components on the feedback path may be avoided, resulting in low phase noise. Moreover, by using a fractional-N divider 510 for downconversion, the phase modulator module 106 needs only a phase-locked loop (PLL), as provided by PFD 502, CP 504, and divider 510. According to an embodiment of the invention, the phase modulator module 106 may not require one or more of a downconversion mixer, local oscillator (LO), or filter.

Figure 6A:
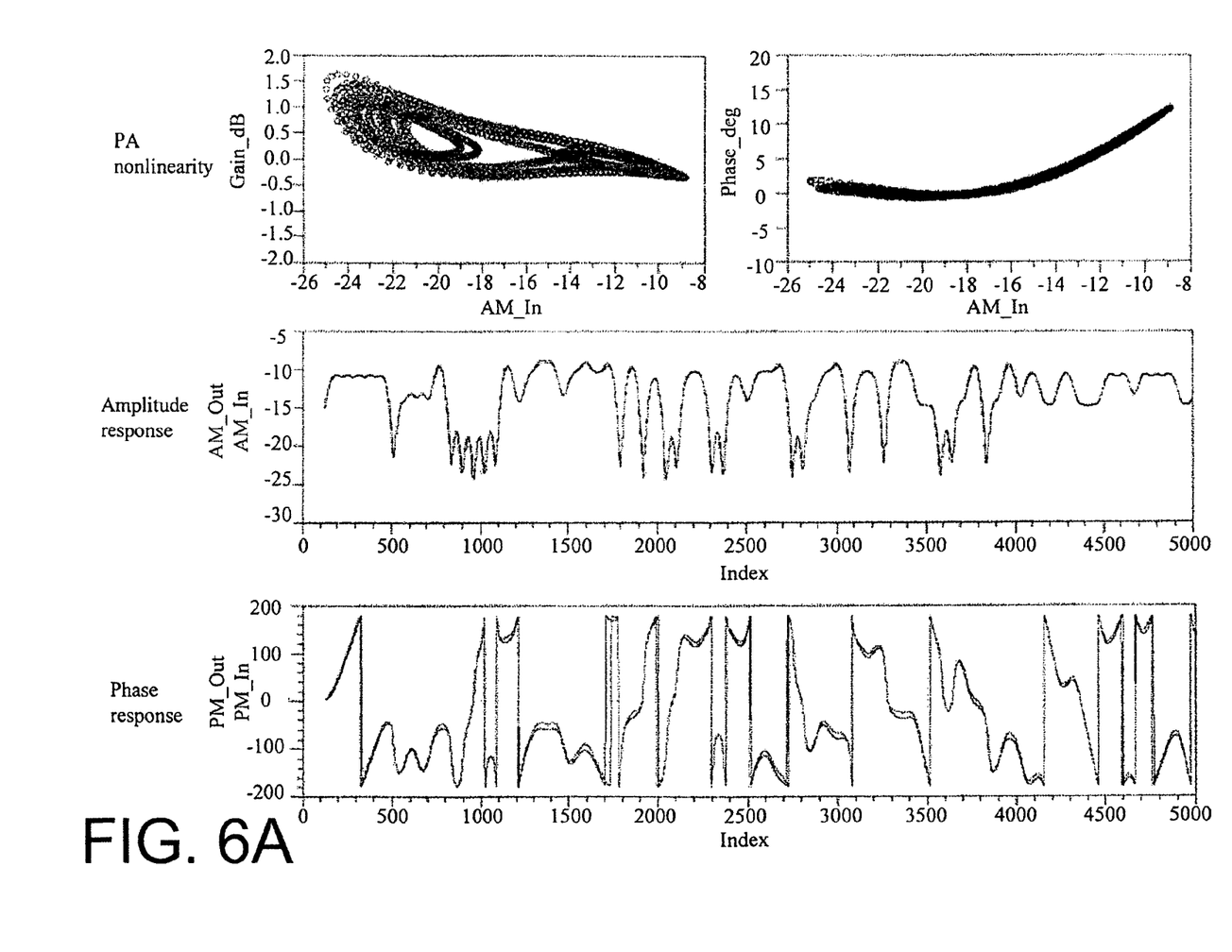
FIGS. 6A and 6B illustrates simulated power amplifier (PA) characteristics without predistortion and with predistortion, respectively, in accordance with an embodiment of the invention.
Figure 6B:
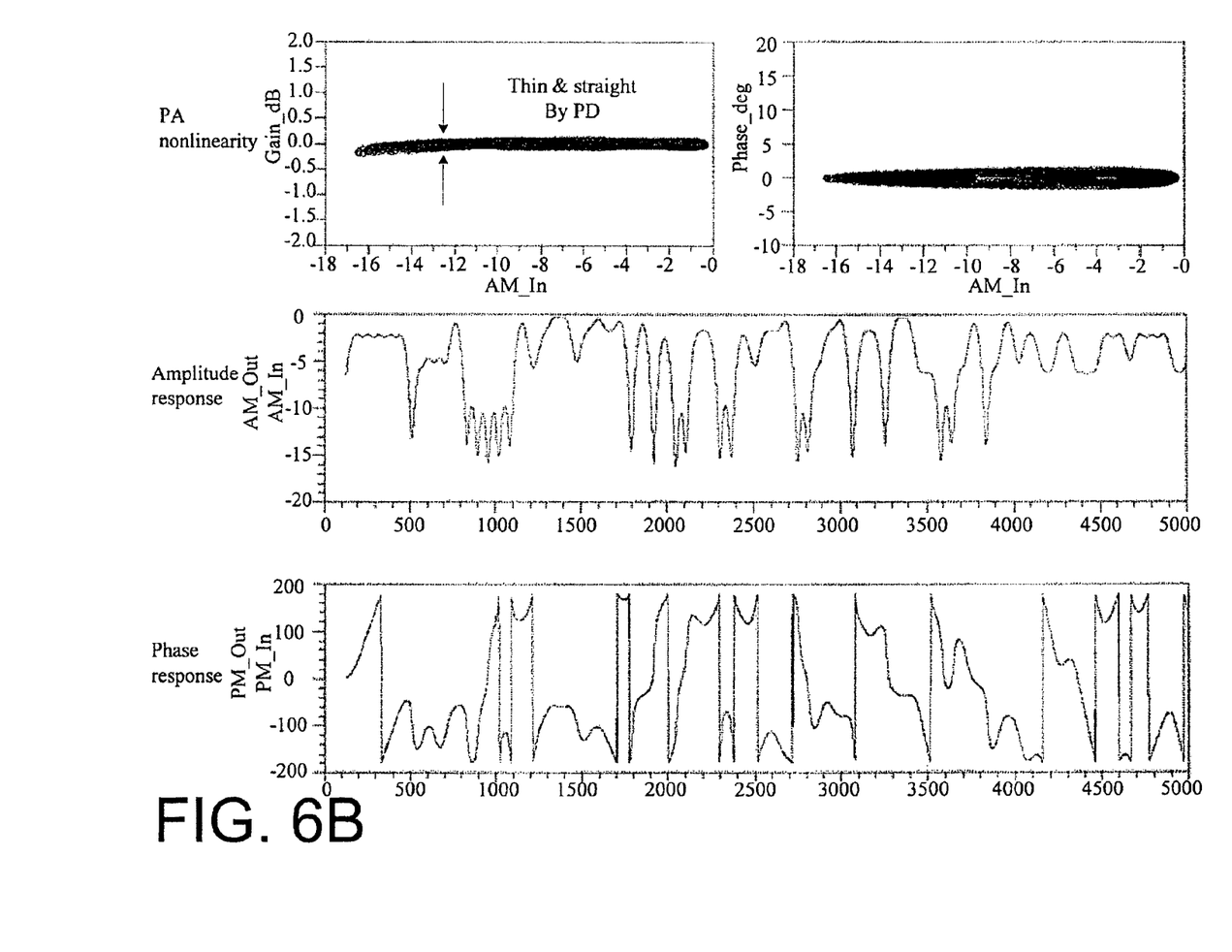

Simulation Results. The time-domain signal test shown in FIGS. 6A and 6B illustrate the improved performance of a PA 124 in accordance with an embodiment of the invention. In particular, FIG. 6A illustrates the results obtained without the use of the linearizer, while FIG. 6B shows the results with the use of the linearizer implemented using the predistortion provided in accordance with an embodiment of the invention. As shown in FIG. 6B, the PA 124 output with the linearizer turned on tracks the original input signal well, and the non-linearity in the amplitude and phase is well linearized, even in the situation with memory effects that display scattered PA 124 characteristics over power.

Figure 7A:
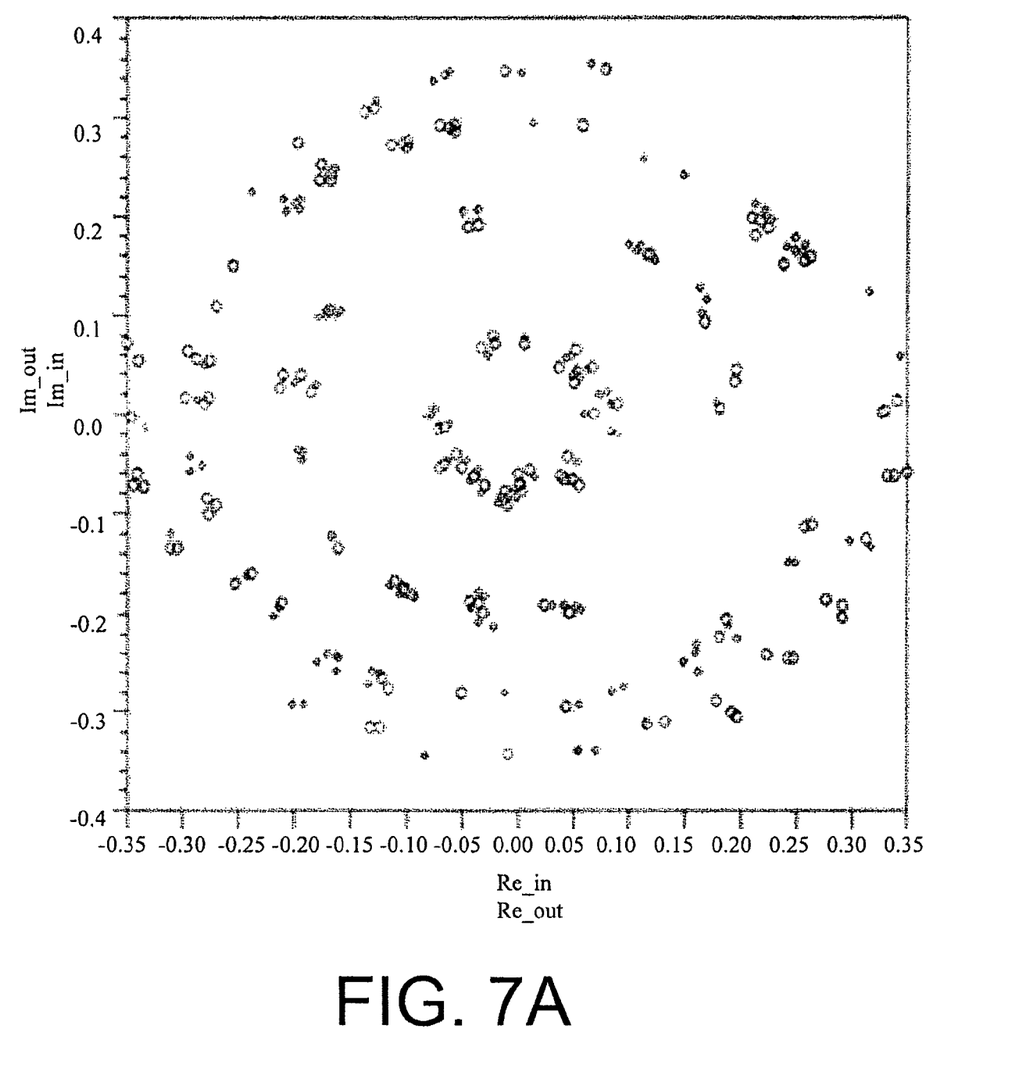
FIGS. 7A and 7B illustrates the simulated constellation results of an EDGE signal without predistortion (EVMrms: 15.6%, EVMpeak: 24.4%) and with predistortion (EVMrms: 3.4%, EVMpeak: 4.9%), in accordance with an embodiment of the invention.
Figure 7B:
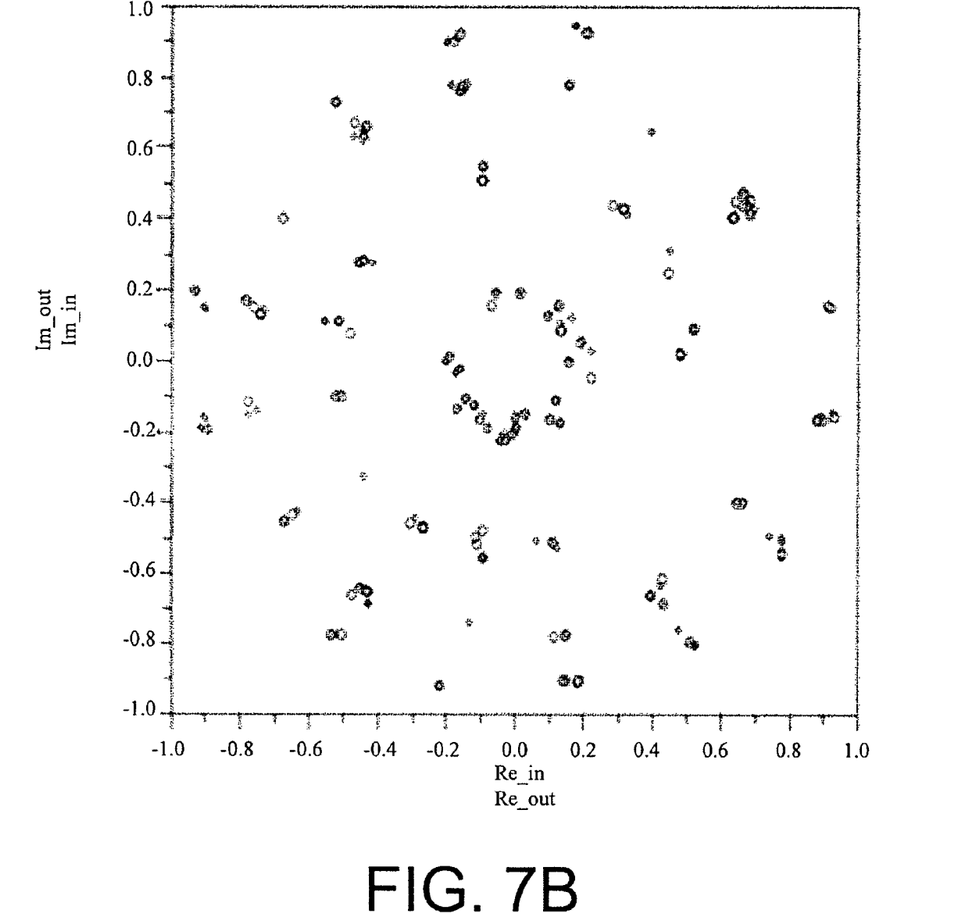
Figure 8:
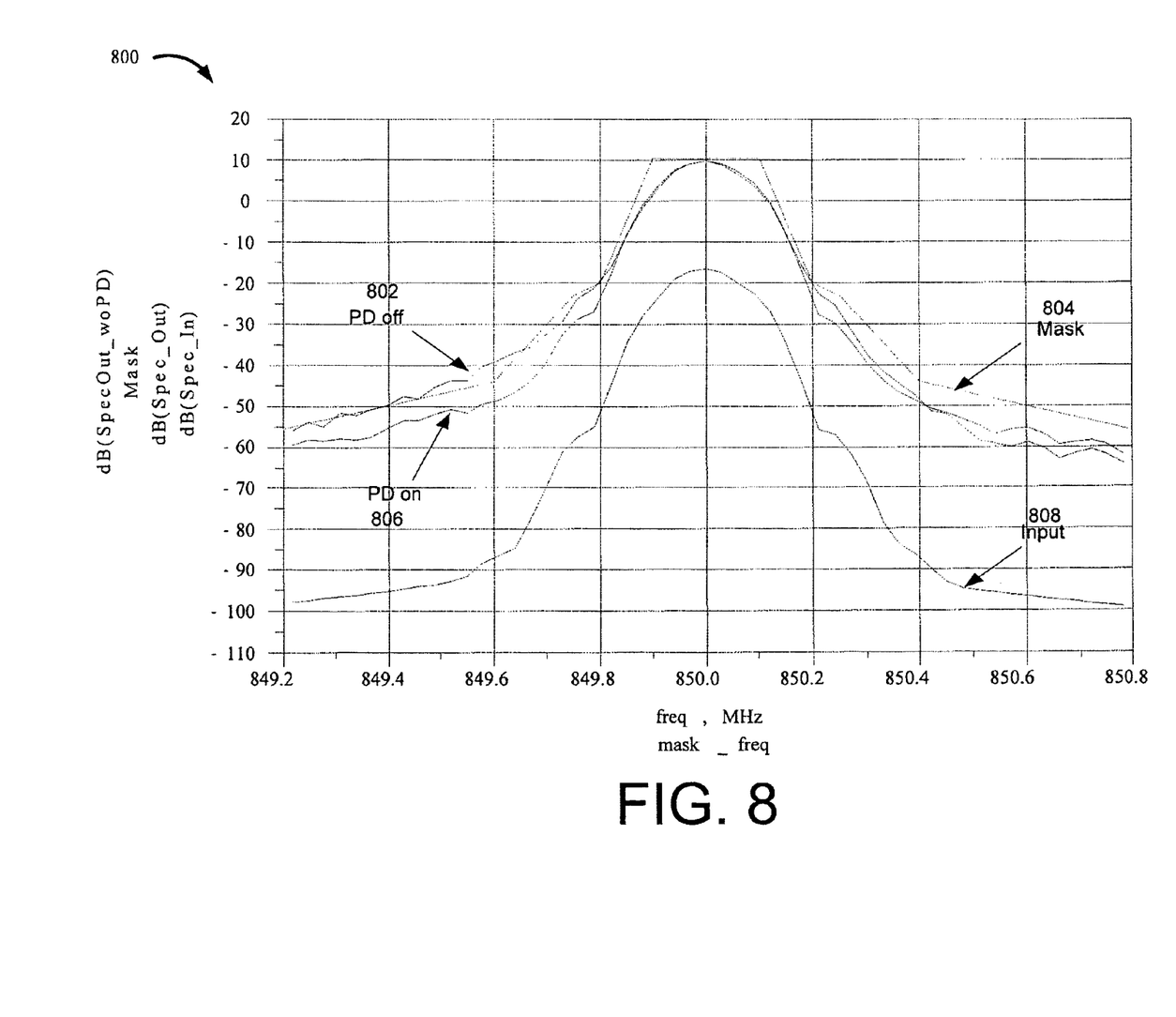
FIG. 8 illustrates the simulated spectrum results of an EDGE signal (Pout_PDoff=21 dBm and Pout_PDon=26 dBm), in accordance with an embodiment of the invention.

Error vector magnitude (EVM) measurement provides a means of characterizing the magnitude and phase variations introduced by the PA nonlinear behavior over a wide dynamic range. As shown in FIGS. 7A and 7B, the EVM simulation results exhibits the improvements of 12.2% in root-mean-square (RMS) and 19.5% in peak by use of the predistortion provided by embodiments of the invention. FIG. 8 shows the spectrum results in which without predistortion, the spectrum 802 violates the regulation mask 804. On the other hand, in FIG. 8, the spectrum 806 from the simulation with the predistortion turned on is well below the mask 804 over the range displayed.

Figure 9:
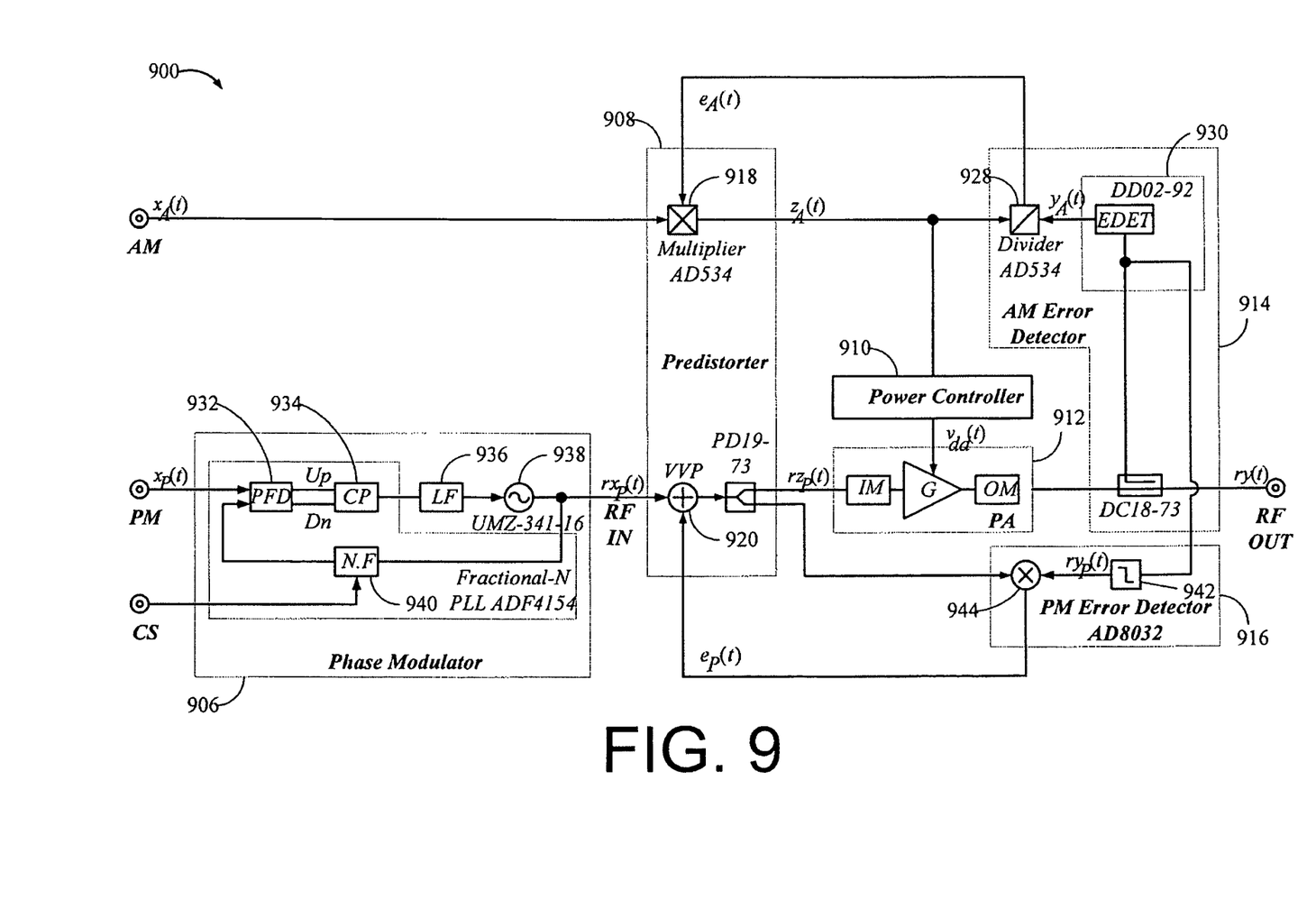
FIG. 9 illustrates a prototyping platform for an illustrative transmitter architecture verification, in accordance with an embodiment of the invention.

Illustrative Implementation. FIG. 9 shows a system 900 implemented in accordance with an embodiment of the invention. The system 900 may include a phase modulator 906 for the upconversion of a phase modulation signal to an RF signal $rx_P(t)$, a predistorter (PD) 908 for the predistortion of the input signal toward a PA 912, an amplifier power controller (APC) 910 for the power regulation and dynamic power control, an amplitude modulation error detector 914 for the AM/AM distortion extraction, and a phase modulation error detector 916 for the AM/PM distortion extraction. As illustrated, the phase modulator 906 includes an analog phase-locked loop (PLL). In particular, the PLL is formed of a phase frequency detector (PFD) 932, a charge pump (CP) 934, a loop filter 936, a voltage-controlled oscillator (VCO) 938, and a frequency divider 940 (e.g., divide by N) placed in the feedback loop, as illustrated in FIG. 9. The PD 908 includes a multiplier 918 for multiplying the amplitude input signal $x_A(t)$ with the amplitude error signal $e_A(t)$. In addition, the PD 908 also includes a phase adder 920 for adding a phase error signal $e_P(t)$ to the phase-modulated RF input signal $rx_P(t)$. The Amplitude Modulation (AM) error detector 914 may include an envelope detector 930 for determining amplitude of the output ry(t) of the PA 912. In addition, the AM error detector includes a divider 928 for calculating an inverse amplitude error signal $e_A(t)$ using the amplitude of the output ry(t) and the predistorted amplitude output of the PD 908. The phase modulation (PM) error detector 916 includes an amplitude limiter 942, a multiplier 944, and a low-pass filter (LPF) 946 for determining an inverse phase error signal $e_P(t)$ using the amplitude-limited output $ry_P(t)$ of the output ry(t) and the phase-predistorted output $rx_P(t)$ of the PD 908. One of ordinary skill in the art will recognize that the system 900 can be applied to a variety of power amplifiers 912, including linear PAs and switching PAs.

Many modifications and other embodiments of the inventions set forth herein will come to mind to one skilled in the art to which these inventions pertain having the benefit of the That which is claimed:

1. A method for providing a linear polar transmitter, comprising:
generating an analog input amplitude signal and an analog input phase signal, wherein the input amplitude signal and the input phase signal are orthogonal components of a system input signal, and wherein the input amplitude signal and the input phase signal are generated on respective first and second signal paths;
processing, in analog, the input amplitude signal along the first signal path using an analog amplitude error signal to generate an analog predistorted amplitude signal;
processing, in analog, the input phase signal along the second signal path using an analog phase error signal to generate an analog predistorted phase signal; and
providing the predistorted amplitude signal along the first signal path and the predistorted phase signal along the second signal path to a power amplifier to generate an output signal,
wherein the amplitude error signal is generated from a first comparison in analog of at least an amplitude portion of the output signal with the predistorted amplitude signal and wherein the phase error signal is generated from a second comparison in analog of at least a phase portion of the output signal with the predistorted phase signal,
wherein the amplitude error signal generated from the first comparison is combined directly by a multiplier with the input amplitude signal along the first signal path to generate the predistorted amplitude signal that is provided to the power amplifier,
wherein the phase error signal generated from the second comparison is combined directly by a phase adder with the input phase signal along the second signal path to generate the predistorted phase signal that is provided to the power amplifier.

2. The method of claim 1, wherein the input amplitude signal and the amplitude error signal are combined directly by the multiplier multiplying the input amplitude signal with the amplitude error signal.

3. The method of claim 1, wherein the input phase signal and the phase error signal are combined directly by the phase adder adding the input phase signal with the phase error signal.

4. The method of claim 1, wherein generating an input amplitude signal and an input phase signal includes generating an input amplitude vector on the first signal path and an input phase vector on the second signal path.

5. The method of claim 1, wherein the output signal is an analog signal.

6. The method of claim 1, wherein the amplitude error signal includes even-order amplitude distortion terms, and wherein the phase error signal includes even-order phase distortion terms.

7. The method of claim 1, wherein the amplitude error signal includes an approximate inverse of a gain of the power amplifier.

8. The method of claim 1, wherein the amplitude portion of the output signal is determined using an envelope detector applied to the output signal, and wherein the phase portion of the output signal is determined using an amplitude limiter applied to the output signal.

9. The method of claim 1, wherein the amplitude error signal is determined by dividing the predistorted amplitude signal by the amplitude portion of the output signal, and wherein the phase error signal is determined by multiplying the predistorted phase signal by the phase portion of the output signal.

10. A system for a linear polar transmitter, comprising:
a first predistortion module that processes, in analog, an analog input amplitude signal along a first signal path using an analog inverse amplitude error signal to generate an analog predistorted amplitude signal;
a second predistortion module that processes, in analog, an analog input phase signal along a second signal path using an analog inverse phase error signal to generate an analog predistorted phase signal, wherein the input amplitude signal and the input phase signal are orthogonal components of a system input signal; and
a power amplifier that receives the predistorted amplitude signal along the first signal path and the predistorted phase signal along the second signal path and generates an output signal based upon the predistorted amplitude signal and the predistorted phase signal, wherein the amplitude error signal is generated from a first comparison in analog of at least an amplitude portion of the output signal with the predistorted amplitude signal and wherein the phase error signal is generated from a second comparison in analog of at least a phase portion of the output signal with the predistorted phase signal,
wherein the amplitude error signal generated from the first comparison is combined directly by a multiplier with the input amplitude signal along the first signal path to generate the predistorted amplitude signal that is provided to the power amplifier,
wherein the phase error signal generated from the second comparison is combined directly by a phase adder with the input phase signal along the second signal path to generate the predistorted phase signal that is provided to the power amplifier.

11. The system of claim 10, wherein the input amplitude signal and the amplitude error signal are combined directly by multiplying, via the multiplier, the input amplitude signal with the inverse amplitude error signal.

12. The system of claim 10, wherein the input phase signal and the phase error signal are combined directly by adding, via the phase adder, the input phase signal with the inverse phase error signal.

13. The system of claim 10, wherein the input amplitude signal is an input amplitude vector and wherein the input phase signal is an input phase vector.

14. The system of claim 10, wherein the output signal is an analog signal.

15. The system of claim 10, wherein the amplitude error signal includes even-order amplitude distortion terms, and wherein the phase error signal includes low-frequency, even-order phase distortion terms.

16. The system of claim 10, wherein the amplitude error signal includes an approximate inverse of a gain of the power amplifier.

17. The system of claim 10, wherein the amplitude portion of the output signal is determined using an envelope detector applied to the output signal, and wherein the phase portion of the output signal is determined using an amplitude limiter applied to the output signal.

18. The system of claim 17, wherein the amplitude error signal is determined by dividing the predistorted amplitude signal by the amplitude portion of the output signal, and wherein the phase error signal is determined by multiplying the predistorted phase signal by the phase portion of the output signal.

19. A system for providing a linear polar transmitter, comprising:
- first means for processing, in analog, an analog input amplitude signal along a first signal path using an analog inverse amplitude error signal to generate an analog predistorted amplitude signal;
- second means for processing, in analog, an analog input phase signal along a second signal path using an analog inverse phase error signal to generate an analog predistorted phase signal, wherein the input amplitude signal and the input phase signal are orthogonal components of a system input signal; and
- a power amplifier that receives the predistorted amplitude signal along the first signal path and the predistorted phase signal along the second signal path and generates an output signal based upon the predistorted amplitude signal and the predistorted phase signal, wherein the amplitude error signal is generated from a first comparison in analog of at least an amplitude portion of the output signal with the predistorted amplitude signal and wherein the phase error signal is generated from a second comparison in analog of at least a phase portion of the output signal with the predistorted phase signal,
- wherein the amplitude error signal generated from the first comparison is combined directly by a multiplier with the input amplitude signal along the first signal path to generate the predistorted amplitude signal that is provided to the power amplifier,
- wherein the phase error signal generated from the second comparison is combined directly by a phase adder with the input phase signal along the second signal path to generate the predistorted phase signal that is provided to the power amplifier.

20. The system of claim 19, wherein the input amplitude signal and the amplitude error signal are combined directly by the multiplier multiplying the input amplitude signal with the inverse amplitude error signal, and wherein the input phase signal and the phase error signal are combined directly by the phase adder adding the input phase signal with the inverse phase error signal.

* * * * *